United States Patent
Bartusiak

Patent Number: 6,016,422
Date of Patent: Jan. 18, 2000

[54] METHOD OF AND APPARATUS FOR GENERATING RADIO FREQUENCY QUADRATURE LO SIGNALS FOR DIRECT CONVERSION TRANSCEIVERS

[75] Inventor: Paul John Bartusiak, Buffalo Grove, Ill.

[73] Assignee: Motorola, Inc., Schaumburg, Ill.

[21] Appl. No.: 08/962,473

[22] Filed: Oct. 31, 1997

[51] Int. Cl.[7] .................................................. H04B 1/50
[52] U.S. Cl. ................................. 455/76; 455/86; 455/324
[58] Field of Search .................................. 455/75, 76, 77, 455/84, 86, 87, 112, 126, 127, 324; 375/219

[56] References Cited

U.S. PATENT DOCUMENTS

| | | | |
|---|---|---|---|
| 5,375,258 | 12/1994 | Gillig | 455/87 |
| 5,761,615 | 2/1998 | Jaffee | 455/324 |
| 5,826,180 | 10/1998 | Golan | 455/324 |
| 5,894,592 | 4/1999 | Brueske et al. | 455/86 |
| 5,896,562 | 4/1999 | Heinonen | 455/76 |

FOREIGN PATENT DOCUMENTS

| | | |
|---|---|---|
| 2196195 | 4/1988 | United Kingdom . |

OTHER PUBLICATIONS

L. Bellarbi et al., "Unity Gain Frequency–Independent Quadrature Phase Shifter" Mar. 28, 1984, Electronics Letters, May 10, 1984; vol. 20, No. 10. pp. 431.

*Primary Examiner*—Thanh Cong Le
*Attorney, Agent, or Firm*—Paul J. Bartusiak

[57] ABSTRACT

An RF quadrature signal generator (320, 370) is configured to receive a clock signal that is buffered by input buffer (404) and then coupled to a frequency divider (412) to produce a divided signal. The divided signal is coupled to a phase shift network (420) to generate a pulse train-pair wherein the two pulse trains of the pulse train-pair are in phase quadrature with one another. Limiting amplifiers (432 and 436) limit the amplitude of the pulse train-pair before they are coupled to a phase determining circuit (460) to generate a control signal representative of the relative phase difference between the amplitude limited pulse train-pair. The control signal is filtered and coupled to an op-amp integrator (474) to produce a feedback signal that is coupled to the phase shift network (420) in order to maintain the amplitude limited pulse train-pair in phase quadrature.

5 Claims, 5 Drawing Sheets

— PRIOR ART —

— PRIOR ART —

METHOD OF AND APPARATUS FOR GENERATING RADIO FREQUENCY QUADRATURE LO SIGNALS FOR DIRECT CONVERSION TRANSCEIVERS

CROSS REFERENCE TO RELATED APPLICATION

The present invention is related to a patent application Ser. No. 08/962,580 filed Oct. 31, 1997 on behalf of Mark Hilbert and assigned to the assignee of the present invention.

FIELD OF THE INVENTION

This invention relates generally to dividing a signal frequency and providing a pair of signals with a predetermined phase relationship and, more particularly, to a quadrature generator system which generates a set of high frequency signals in phase quadrature with one another suitable for a direct conversion communication system.

BACKGROUND OF THE INVENTION

A communication system is comprised, at a minimum, of a transmitter and a receiver interconnected by a transmission channel. In the communication system, a communication signal is transmitted by the transmitter upon the transmission channel to be received by the receiver. In a radio communication system, the transmission channel comprises a radio frequency channel defined by a range of frequencies of the electromagnetic frequency spectrum. A transmitter operative in a radio communication system must convert the communication signal into a form suitable for transmission upon the radio-frequency channel.

Conversion of the communication signal into the form suitable for transmission upon the radio frequency (RF) channel is effectuated by a process referred to as modulation. In such a process, the communication signal is impressed upon an RF carrier signal. The resultant signal is commonly referred to as a modulated carrier signal. The transmitter includes circuitry operative to perform such a modulation process.

The receiver of the radio communication contains circuitry analogous to, but operative in a manner reverse with that of, the circuitry of the transmitter. The receiver is operative to perform a process referred to as demodulation.

In radio communication systems, such as cellular telephony, specific modulation schemes are employed to minimize the frequency spectrum necessary for communication and thereby maximize the call capacity of the radio communication system. The modulation schemes utilized usually involve converting the communication signal into discrete form, and the resultant modulated signal is typically of a reduced frequency spectrum.

One method of transmitting a communication signal in discrete form is through the use of quadrature modulation. In quadrature modulation, the binary data stream of the encoded communication signal is separated into bit pairs. Such bit pairs are utilized to cause phase shifts of the RF carrier signal in increments such as plus or minus $\pi/4$ radians or plus or minus $3\pi/4$ radians, according to the values of the individual bit pairs of the encoded signal.

The phase shifts are effectuated by applying the binary data stream comprised of the bit pairs to a pair of mixer circuits. A sine component of a carrier signal is applied to an input of a first mixer circuit, and a cosine component of a carrier signal is applied to an input of a second mixer circuit. The sine and cosine components of the carrier signal are in a relative phase relationship of ninety degrees with one another, or phase quadrature. A quadrature generator is utilized to generate and apply the sine and cosine components of the carrier signal to the first and second mixer circuits of the pair of mixer circuits, respectively.

In many radio communication systems, a heterodyne architecture is used for the transmitter and receiver in order to reduce the susceptibility to interfering signals that may be present. In a heterodyne architecture, frequency conversion to an intermediate frequency (IF) is first performed to obtain the filter selectivity needed to reject interfering signals. Conversion to an IF aids in the selectivity process and allows the selectivity to be achieved with physically realizable filters. A drawback to the heterodyne architecture is that the conversion to an IF requires extra circuit complexity, more power consumption, and more physical space. The filters used are usually ceramic filters or surface acoustic wave (SAW) filters, which are both expensive and physically large.

To circumvent the drawbacks of a heterodyne architecture, a direct conversion architecture is employed. In a direct conversion architecture, there is no IF. For example, a direct conversion transmitter converts the baseband modulation inputs directly to the transmit RF signal. The direct conversion receiver downconverts the received RF signal directly to baseband.

One major drawback to the direct conversion approach, however, is that remodulation of the voltage controlled oscillator (VCO) can occur. Since there is no IF generated, the power amplifier (PA) output of the transmitter is at the same frequency as the VCO that generates the RF carrier signal. When a portion of the PA output signal is coupled back onto the VCO (either through radiation or a conductive leakage path), injection locking occurs. The PA output signal then modulates the VCO in an undesired fashion, and gross error results in the modulated transmit signal.

One method that has been employed in the prior art to eliminate the remodulation effect in a direct conversion architecture is the use of an offset loop. The basic structure of a direct conversion quadrature modulation transmitter employing an offset loop is shown in FIG. 1. A first RF signal generated from an RF VCO 116 is applied to an offset mixer 114 and mixed with an offset frequency signal generated by an offset VCO 112. The RF carrier signal produced from the offset mixer 114 is then filtered through RF filter 110 and applied to a quadrature signal generator system 108. The quadrature signal generator system 108 generates a pair of signals in phase quadrature (i.e. 90 degree phase difference). A first output of the quadrature signal generator system 108 is applied to a carrier signal input 120 of a first mixer circuit 104, and a second output of the quadrature signal generator system 108 is applied to a carrier signal input 122 of a second mixer circuit 106. A first modulation signal, I, is applied to a modulation input 100 of the first mixer circuit 104, and a second modulation signal, Q, is applied to a modulation input 102 of the second mixer circuit 106. The modulated transmit signal produced at the modulator output 118 is applied to RF Transmit block 132, which may be comprised of power control circuitry and a power amplifier. The final output signal is produced at transmitter output 134.

In the direct conversion transmitter employing an offset loop, the RF VCO 116 and the offset VCO 112 operate at different frequencies than the ultimate transmit frequency emanating from the transmitter output 134, so the RF VCO 116 and the offset VCO 112 are immune to remodulation.

The modulation signals are converted directly to the transmit frequency (i.e. there is no IF) so IF filtering is not needed. Because of the mixing between the RF VCO 116 signal and the offset VCO 112 signal, however, RF filter 110 is needed to reduce spurious signals generated in the offset loop. Also, extra circuitry and power consumption are needed for the offset mixer 114 and the offset VCO 112.

A method that has been used in the prior art to obviate the need for an offset loop in a direct conversion transmitter is operation of an RF VCO at twice the frequency of the transmit signal frequency. The RF signal produced by the RF VCO is applied to a quadrature signal generator system to both divide the frequency of the RF signal in half and generate a pair of signals in phase quadrature. Having the RF VCO operate at twice the transmit frequency reduces the susceptibility of the RF VCO to remodulation and removes the necessity for an offset loop, thereby reducing size, power consumption, and cost.

In a direct conversion radio transceiver, an important aspect of the system is the quadrature signal generation. A prior art method for quadrature signal generation is shown in FIG. 2. The method uses a flip-flop pair comprised of first and second flip-flops, the first flip-flop being a master flip-flop 204 and the second flip-flop a slave flip-flop 208. An output of master flip-flop 204 is applied on line 212 to an input of slave flip-flop 208. An inverted output of slave flip-flop 208 is applied on line 216 to an input of master flip-flop 204.

Clock oscillator 228 generates a clock signal on line 232 which is applied to an input of master flip-flop 204 and inverted, by way of an inverting input 236 of slave flip-flop 208, and then applied to flip-flop 208.

Outputs generated by master flip-flop 204 and slave flip-flop 208 are also generated on lines 220 and 224, respectively. The signals generated on lines 220 and 224 are of substantially the same frequency but offset in phase. When the clock signal generated by clock oscillator is of exactly a 50—50 duty cycle, the signals generated on lines 220 and 224 are in a quadrature phase relationship.

A byproduct of the quadrature signal generation method shown in FIG. 2 is that the frequency of the signals appearing on lines 220 and 224 is divided in half. Developing quadrature signals utilizing a master-slave flip-flop pair can thus be a method for implementing a direct conversion transmitter having a VCO with reduced susceptibility to remodulation. The RF VCO operates at twice the transmit frequency and is applied to the quadrature signal generator, and the signals from the quadrature signal generator are in phase quadrature and are divided in half to the desired transmit frequency.

The frequency performance of the flip-flop pair is dependent upon the load for which it is driving. For example, in FIG. 2, as the capacitance on lines 220 and 224 of the flip-flop pair increases, the maximum frequency that the flip-flop pair can operate decreases. Therefore, with a given capacitive load, a frequency is ultimately reached where the flip-flop pair can no longer accurately track edge transitions of the clock signal, and the flip-flop pair no longer functions properly. When differential quadrature signals are extracted from the flip-flop pair, the capacitive load is even greater. Therefore, a way to increase the frequency performance of the flip-flop pair is to reduce the capacitive loading. There is, however, a limit to the amount of reduction in the capacitive loading that can be achieved and therefore a limit to the maximum frequency of operation of the quadrature signal generation system employing a flip-flop pair.

What is needed, therefore, is a quadrature signal generator system with extended frequency performance that can be used in a direct conversion communication system to both divide the frequency of the RF VCO carrier signal in half and generate signals in phase quadrature.

FIG. 6 is a circuit diagram of a prior art passive phase shift network 600. The passive phase shift network 600 has two resistors 601 and 603 forming a resistor pair (R pair) and two capacitors 605 and 607 forming a capacitor pair (C pair). The R pair and the C pair are connected together in a bridge arrangement as is well known in the art. The passive phase shift network 600 receives differential input signals X(0°) and X(180°) at terminals 609 and 609, respectively, and produces differential output signals Y(0°) and Y(180°) at terminals 611 and 613, respectively. The passive phase shift network 600 is represented by the following Laplace transfer function Y(0°)/X(0°)=(1−sRC)/(1+sRC). This transfer function is a first order all-pass function, with phase angle of $-2\tan^{-1}(wRC)$. When w=1/RC, the differential output signals Y(0°) and Y(180°) are in phase quadrature relative to the differential input signals X(0°) and X(180°), respectively, when the differential input signals X(0°) and X(180°) are sinusoidal. The phase shift network 600 is passive because the phase quadrature relationship between the differential output signals Y(0°) and Y(180°) and the differential input signals X(0°) and X(180°) is fixed.

The phase quadrature relationship between the differential output signals Y(0°) and Y(180°) and the differential input signals X(0°) and X(180°) can varied about ideal phase quadrature by varying either the R pair or C pair in the bridge arrangement. For example, the C pair may be implemented as voltage-variable capacitors in the form of integrated reverse-biased NPN junctions. However, voltage-variable capacitors in the form of integrated reverse-biased NPN junctions do not have the sensitivity (ΔC per ΔV) needed to allow complete integration of the quadrature generator. The sensitivity must be large enough to cover the make tolerance of the R pair and the C pair which determine the quadrature frequency.

FIG. 7 is a circuit diagram of a prior art variable phase shift network 700. The variable phase shift network 700 implements each resistor of the R pair 601 and 603 as voltage-variable resistors in the form of FETS 701 and 703, respectively, operating in their linear region. A control voltage, Vcntl, controls each of the FETS 701 and 703 to vary the phase quadrature relationship between the differential output signals Y(0°) and Y(180°) and the differential input signals X(0°) and X(180°) about ideal phase quadrature. To achieve a maximum operating frequency the variable phase shift network 700 is designed for a minimum insertion loss (i.e. a minimum drain-source resistance ($R_{ds}$)) which requires using a FET with large width/length (W/L) gate ratio. However, the large gate ratio introduces parasitic capacitances that severely limits the maximum operating frequency for a given integrated circuit process.

Patent application UK 2196195A teaches using varactors as variable capacitive elements. Since current integrated circuit processes do not typically permit varactors, this implementation would require discrete parts external to an integrated circuit. Further, this application teaches using a single-ended input signal and therefore does not compensate for even order distortion generated in the varactors. Therefore, it does not produce the waveform symmetry required for accurately detecting quadrature in an exclusive-OR feedback phase locked loop (PLL) and it is not suitable for precision quadrature mixing applications.

Electronics Letters, May 10, 1984, Vol.20 No.10 teaches a PLL phase shift network. This PLL phase shift network uses a FET as a variable resistor element and receives a single-ended input signal. Therefore, this design suffers from the same problems as discussed with the FETs in FIG. 7 and the single ended signal in patent application UK 2196195A.

Accordingly, there is a further need for a quadrature generator having a variable phase shift network that splits a signal into components whose phase is varied about ideal quadrature, that has a sensitivity range large enough to cover the make tolerances of all the elements determining an absolute phase shift to permit integration of the quadrature generator on a custom integrated circuit, that has a wide range of operating frequencies and that overcomes the imbalance created by single-ended signals.

DETAILED DESCRIPTION OF A PREFERRED EMBODIMENT

The present invention advantageously provides a system for dividing the frequency of an RF signal in half and generating a pair of RF signals with a pre-determined phase relationship. The present invention further advantageously provides receiver and transmitter circuitry including an RF quadrature signal generator for dividing the frequency of an RF signal in half and generating a pair of RF signals in phase quadrature suitable for a direct conversion radio transceiver.

An input signal at twice the desired carrier frequency is applied to the inputs of a flip-flop pair. The flip-flop pair divides the input signal frequency in half. Rather than extracting both an in-phase and a quadrature signal from the flip-flop pair, only an in-phase frequency divided signal is extracted. The loading on the output of the flip-flop pair is thus reduced, and the speed performance of the flip-flop pair is thus increased. The frequency divided signal from the flip-flop pair is then applied to a phase shift network, and the phase shift network produces a pulse train-pair in response to the frequency divided signal, where the pulse train-pair comprises a first pulse train and a second pulse train wherein the first pulse train and the second pulse train are at substantially the same frequency but offset in phase relative to one another. The pulse train-pair is applied to limiting amplifiers in order to limit the amplitudes of the pulse train pair.

Figure 3:
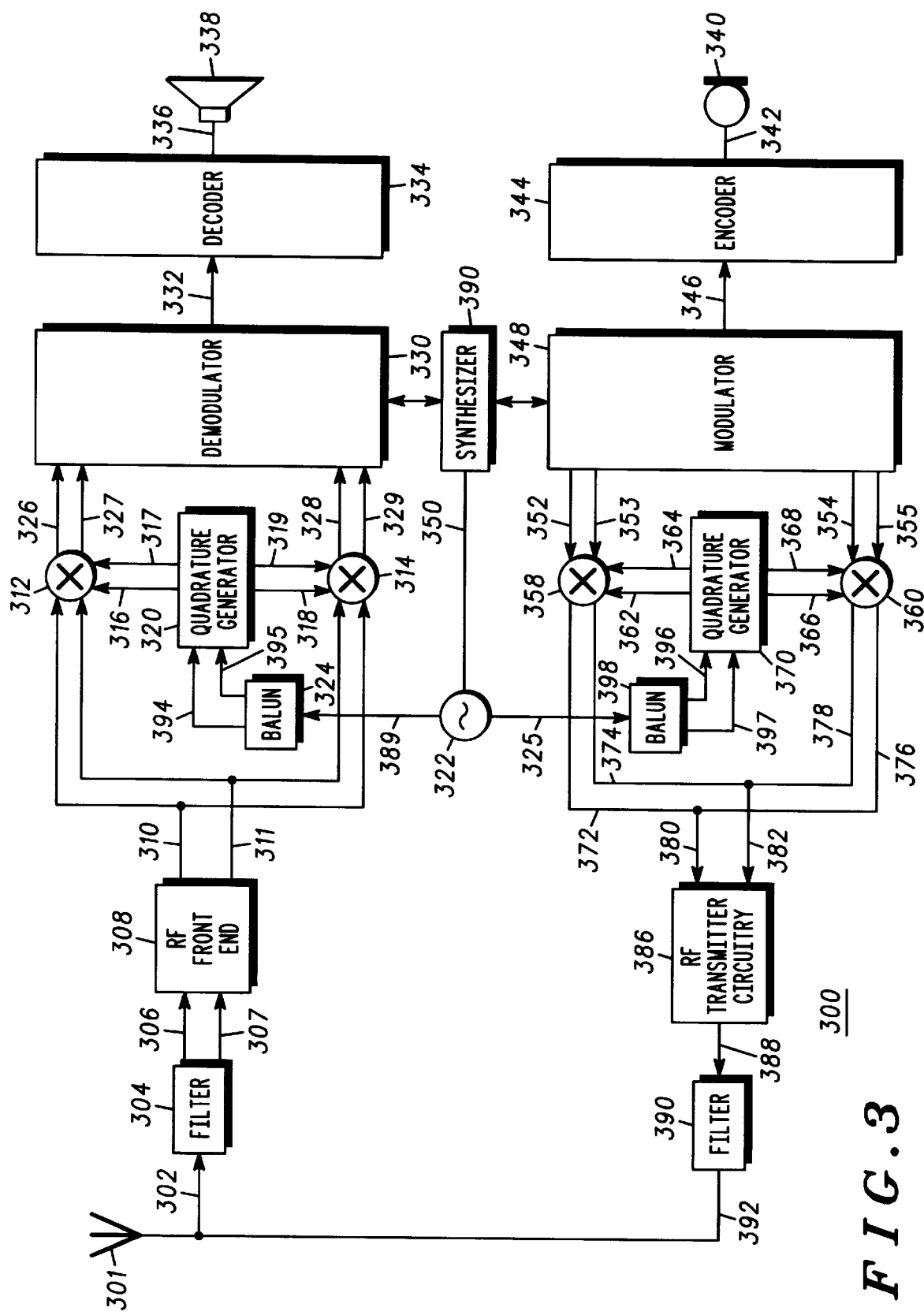
FIG. 3 is a block diagram of a direct conversion radio transceiver (a preferred embodiment of the present invention) employing a high frequency quadrature signal generator in accordance with a preferred embodiment of the present invention.

The preferred embodiment of the present invention encompasses an RF quadrature signal generator implemented in a direct conversion radio transceiver. FIG. 3 is an illustration in block diagram form of a direct conversion radio transceiver 300. The portion of the direct conversion radio transceiver 300 shown in the top portion of FIG. 3 forms the direct conversion receiver, and the portion of the direct conversion radio transceiver 300 shown in the bottom portion of FIG. 3 forms the direct conversion transmitter.

In the direct conversion receiver portion, a modulated receive signal transmitted to direct conversion radio transceiver 300 is detected by antenna 301 and applied, by way of line 302, to filter block 304. Filter block 304 generates a filtered receive signal and also contains circuitry, well known in the art, to convert the filtered receive signal to a differential filtered signal on lines 306 and 307. A differential signal comprises a pair of signals of the same frequency but offset in phase with each other by 180°. The differential filtered signal on lines 306 and 307 is coupled to RF front end block 308.

RF front end block 308 is comprised of conventional low noise amplification circuitry and conventional automatic gain control circuitry to produce an amplified differential receive signal on lines 310 and 311. The amplified differential receive signal is applied to first inputs of mixer circuits 312 and 314. Mixer circuits 312 and 314 are sometimes referred to as the receive "I" and "Q" mixers, respectively.

RF VCO 322, sometimes referred to as a clock oscillator, produces an RF carrier signal (high frequency clock signal) on line 389 that is twice the frequency of the modulated receive signal detected at antenna 301. In the preferred embodiment, RF VCO 322 is a phase-locked oscillator of a desired oscillation frequency, wherein the frequency is set and maintained by a frequency control signal appearing on line 350 that is produced from a conventional synthesizer, here synthesizer 390. The RF carrier on line 389 is coupled to a conventional balun circuit, here balun 324, and converted to a differential clock signal on lines 394 and 395. The differential clock signal is coupled to RF quadrature signal generator 320.

The RF quadrature signal generator 320 produces a differential pulse train pair comprised of a first differential pulse train on lines 316 and 317 and a second differential pulse train on lines 318 and 319. The first and second differential pulse trains are in phase quadrature with one another. In alternate embodiments, the RP quadrature signal generator 320 produces a pulse train pair comprised of a first pulse train and a second pulse train wherein the first and second pulse trains are single-ended signals. A single-ended signal is one that does not have a companion signal of the same frequency and offset in phase by 180°. Also in alternate embodiments, balun 324 is not utilized so that the RF carrier signal on line 389 is applied directly to the RF quadrature signal generator 320 as a single-ended signal.

The first and second differential pulse trains are applied to second inputs of mixer circuits 312 and 314, respectively, to produce a down-converted mixed signal pair comprising a first down-converted differential mixed signal on lines 326 and 327 and a second down-converted differential mixed signal on lines 328 and 329. The down-converted mixed signal pair is sometimes referred to as "baseband signals" comprising a first baseband signal and a second baseband signal, since the carrier signal is removed from the modulated receive signal. Also, the first and second down-converted differential mixed signals are in phase quadrature with one another, and so they are sometimes referred to as the receive "I" and "Q" signals, respectively. In alternate embodiments, the down-converted mixed signal pair comprises a first down-converted mixed signal and a second down-converted mixed signal each of which is a single-ended signal.

The down-converted mixed signal pair is coupled to a conventional demodulator, here demodulator 330. The demodulator 330 generates a demodulated signal on line 332, and the demodulated signal is then coupled to a conventional decoder, here decoder 334. Decoder 334 generates a decoded signal on line 336 and supplies the decoded signal to a transducer, here speaker 338.

In the direct conversion receiver, the modulated receive signal detected at antenna 301 is not first converted to an IF signal. Directly converting the modulated receive signal to a baseband signal thereby circumvents the need for costly, physically large IF filters. By having the RF VCO 322 operate at twice the modulated receive signal frequency, the RF quadrature signal generator 320 divides the RF carrier signal in half, causing the mixer circuits 312 and 314, respectively, to directly down-convert the modulated receive signal. The necessity for an offset loop in the direct conversion receiver is thus negated.

In the direct conversion transmitter portion of the direct conversion radio transceiver 300, a transducer, here microphone 340, first converts a voice signal into an electrical signal onto line 342.

The electrical signal on line 342 is coupled to a conventional encoder, here encoder 344. Encoder 344 encodes the signal supplied thereto to produce an encoded signal on line 346. The encoded signal on line 346 is coupled to conventional modulation circuitry, here modulator 348. Modulator 348 modulates the encoded signal supplied thereto in order to generate a modulated signal pair comprising a first modulated signal, here a first differential modulated signal appearing on lines 352 and 353, and a second modulated signal, here a second differential modulated signal appearing on lines 354 and 355. The first and second differential modulated signals are maintained in a quadrature phase relationship with each other and are sometimes referred to as the transmit "I" and "Q" signals, respectively.

The first and second differential modulated signals are also sometimes referred to as transmit baseband signals. In alternate embodiments, the first and second modulated signals are single-ended signals.

The first and second differential modulated signals are coupled to first inputs of mixer circuits 358 and 360, respectively. Mixer circuits 358 and 360 are sometimes referred to as the transmit "I" and "Q" mixers, respectively.

RF VCO 322 produces an RF carrier signal (high frequency clock signal) on line 325 that is twice the frequency of the transmit electromagnetic signal, or communication signal, transmitted from antenna 301. The frequency of the RF carrier signal produced by RF VCO 322 is set and maintained by a frequency control signal appearing on line 350 that is produced from a conventional synthesizer, here synthesizer 390. The RF signal produced by RF VCO 322 on line 325 is coupled to a conventional balun circuit, here balun 398, and converted to a differential clock signal on lines 396 and 397. The differential clock signal is coupled to RF quadrature signal generator 370.

The RF quadrature signal generator 370 produces a pulse train pair comprised of a first differential pulse train on lines 362 and 364 and a second differential pulse train on lines 366 and 368. The first and second differential pulse trains are in phase quadrature with one another. In alternate embodiments, the RF quadrature signal generator 370 produces a pulse train pair comprised of first and second pulse trains wherein the first and second pulse trains are single-ended signals. Also in alternate embodiments, balun 398 is not utilized so that the RF carrier signal on line 325 is applied directly to the RF quadrature signal generator 370 as a single-ended signal.

The first and second differential pulse trains are applied to second inputs of mixer circuits 358 and 360, respectively, to produce an up-converted mixed signal pair comprising a first up-converted mixed signal, here first up-converted differential mixed signal appearing on lines 372 and 374, and a second up-converted mixed signal, here second up-converted differential mixed signal appearing on lines 376 and 378. Since the first differential pulse train appearing on lines 362 and 364 and the second differential pulse train appearing on lines 366 and 368 are in phase quadrature with one another, the first up-converted differential mixed signal appearing on lines 372 and 374 contains a pair of sidebands each of which is at either a 0° or 180° phase relationship relative to each of a pair of sidebands contained within the second up-converted differential mixed signal appearing on lines 376 and 378. In alternate embodiments, the up-converted mixed signal pair comprises a first and second up-converted mixed signal wherein first and second up-converted mixed signals are single-ended signals.

The first and second up-converted differential mixed signals are combined to form a differential transmit signal appearing on lines 380 and 382. The differential transmit signal is coupled to RF transmit block 386. RF transmit block 386 is comprised of signal amplification circuitry, power control circuitry, and differential to single-ended conversion circuitry. All of the circuitry in RF transmit block 386 is conventional circuitry well known in the art. RF transmit block 386 generates an amplified signal on line 388, and the amplified signal is coupled to filter 390, which generates a transmit electromagnetic signal on line 392. Line 392 is coupled to antenna 301 whereat the transmit electromagnetic signal is transmitted.

Thus, a preferred embodiment of the direct conversion transmitter is a combination of baseband modulation circuitry with the quadrature modulation circuitry of a quadrature mixer. The transmit baseband signals are not converted to an IF signal before ultimately being transmitted from antenna 301. Directly converting the transmit baseband signals to the transmit electromagnetic signal frequency circumvents the need for costly, physically large IF filters. By having the RF VCO 322 operate at twice the transmit electromagnetic signal frequency, the RF quadrature signal generator divides the RF carrier signal in half and causes the transmit I and Q mixers to directly up-convert the transmit baseband signals to the transmit electromagnetic signal.

Figure 4:
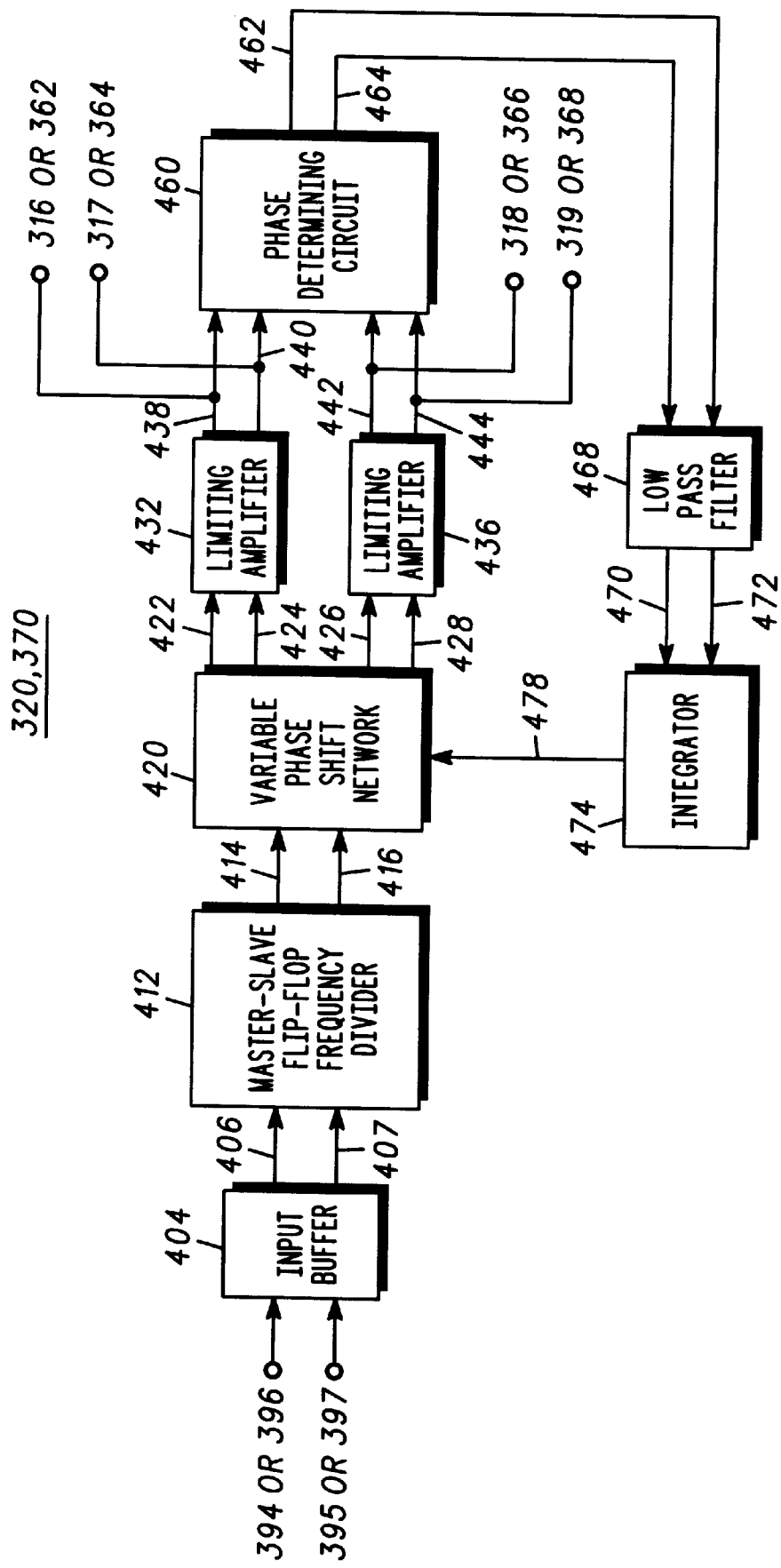
FIG. 4 is a block diagram of an RF quadrature signal generator in accordance with a preferred embodiment of the present invention.

The RF quadrature signal generator 320 or 370, when used in a direct conversion receiver or a direct conversion transmitter, respectively, is shown in FIG. 4. The differential clock signal is coupled through inputs 394 and 395 when the RF quadrature signal generator 320 is used in a direct conversion receiver, or lines 396 and 397 when the RF quadrature signal generator 370 is used in a direct conversion transmitter. The differential clock signal is coupled to a conventional amplifier, here input buffer 404, to produce a buffered high frequency clock signal, here a buffered differential signal on lines 406 and 407. In an alternate embodiment, the differential clock signal is a single-ended clock signal and only one input, either 394 or 395, would therefore be needed. When the clock signal is single-ended, the input buffer 404 would convert the single-ended signal into a differential signal on lines 406 and 407.

The buffered differential signal is coupled to frequency divider 412. In the illustrated embodiment, the frequency divider 412 comprises a flip-flop pair which may easily be implemented into an integrated circuit.

Frequency divider 412 divides the buffered differential signal frequency in half to produce a frequency divided signal appearing as a differential signal on lines 414 and 416. The frequency divided differential signal is coupled to a phase shift network, here variable phase shift network 420. The variable phase shift network 420 produces a pulse train-pair comprised of a first pulse train and a second pulse train. In a preferred embodiment, the first pulse train appears as a first differential pulse train on lines 422 and 424 and the second pulse train appears as a second differential pulse train on lines 426 and 428. The first and second differential pulse trains are at substantially the same frequency and offset in phase relative to one another. In the preferred embodiment, the first and second differential pulse trains are in phase quadrature with each other. In an alternate embodiment, the first pulse train and the second pulse train are each single-ended signals.

The first and second differential pulse trains are coupled to limiting amplifiers, here first limiting amplifier (432) and second limiting amplifier (436), respectively, to produce an amplitude limited pulse train pair comprising a first amplitude limited differential pulse train and a second amplitude limited differential pulse train. The amplitudes of the first and second amplitude limited differential pulse trains are then substantially equal. When the RF quadrature signal generator 320 is used in a direct conversion receiver, a first portion of the first amplitude limited differential pulse train appearing on lines 316 and 317 is coupled to mixer circuit 312, and a first portion of the second amplitude limited differential pulse train appearing on lines 318 and 319 is coupled to mixer circuit 314. When the RF quadrature signal generator 370 is used in a direct conversion transmitter, a first portion of the first amplitude limited differential pulse train appearing on lines 362 and 364 and is coupled to mixer circuit 358, and a first portion of the second amplitude limited differential pulse train appearing on lines 366 and 368 and is coupled to mixer circuit 360.

A second portion of the first amplitude limited differential pulse train appearing on lines 438 and 440 and a second portion of the second amplitude limited differential pulse train appearing on lines 442 and 444 is coupled to a conventional phase determining circuit, here phase determining circuit 460. In the preferred embodiment, phase determining circuit 460 comprises an exclusive-or-logic gate as described in U.S. Pat. No. 5,375,258. Because the second portions of the first and second amplitude limited differential pulse trains are out of phase with one another but of similar frequencies, the exclusive-or-logic gate of phase determining circuit 460 generates a periodic signal on lines 462 and 464 that is twice the frequency of the amplitude limited differential pulse trains. The exclusive-or-logic gate of phase determining circuit 460 also detects a relative phase difference between the phases of the first and second amplitude limited differential pulse trains and generates a control signal on lines 462 and 464 that is representative of the relative phase difference between the first and second amplitude limited differential pulse trains.

Lines 462 and 464 are coupled to a conventional low pass filter 468 in order to remove the periodic signal produced by the phase determining circuit 460 that is twice the frequency of the amplitude limited differential pulse train. A filtered control signal is generated on lines 470 and 472. The filtered control signal is coupled to a conventional op-amp integrator, here integrator 474, to produce a feedback signal appearing on line 478. The feedback signal is coupled to the variable phase shift network 420.

The feedback signal causes the variable phase shift network 420 to adjust the relative phase difference between the first and second amplitude limited differential pulse trains when the first and second amplitude limited differential pulse trains are beyond phase quadrature with one another, thereby positioning and maintaining the first and second amplitude limited differential pulse trains in phase quadrature. The phase determining circuit 460, low pass filter 468, and op-amp integrator 474 are components of a feedback control circuit that forms a feedback control loop that positions and maintains the first and second amplitude limited differential pulse trains in phase quadrature with one another.

In an alternate embodiment, the variable phase shift network 420 is a conventional resistor-capacitor circuit which results in a fixed phase shift network. A first differential pulse train on lines 422 and 424 and a second differential pulse train on lines 426 and 428 is generated wherein a predetermined phase relationship is produced between the fist and second differential pulse trains. No feedback circuitry is utilized to detect or adjust the phase shift.

By extracting only a single differential signal rather than a pair of differential signals in phase quadrature from the frequency divider 412, the capacitive loading on frequency divider 412 is reduced, and the frequency performance of the frequency divider 412 and the RF quadrature signal generator (320, 370) is thus increased. The differential quadrature signals are extracted from the variable phase shift network 420.

Figure 5:
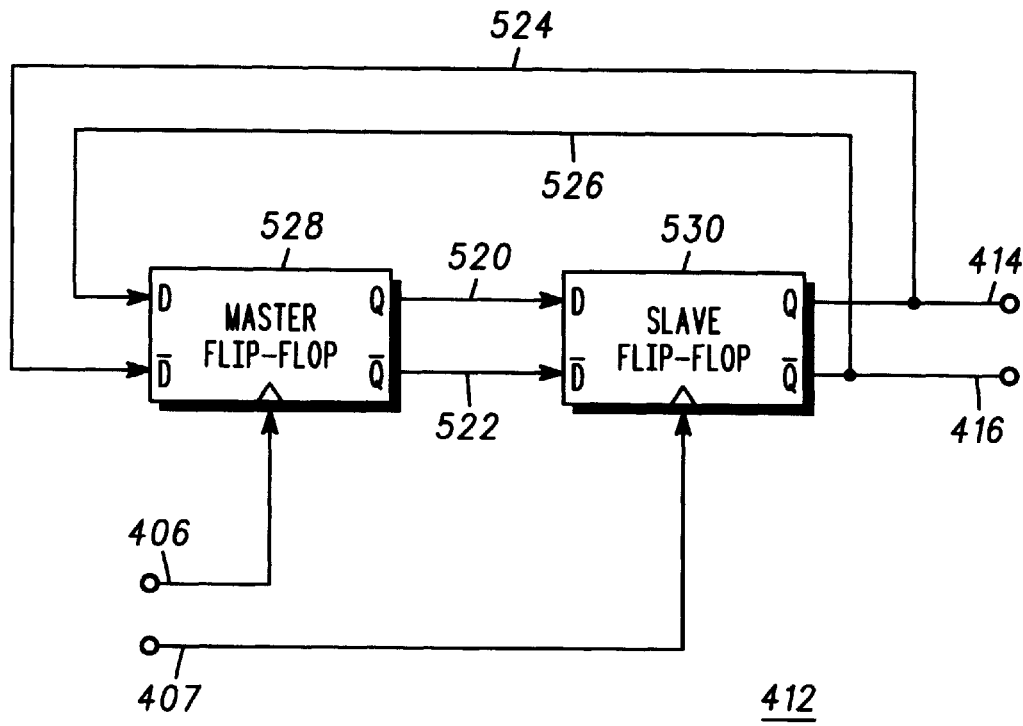
FIG. 5 is block diagram of a flip-flop pair used for dividing a clock signal frequency in half in accordance with a preferred embodiment of the present invention.
Figure 6:
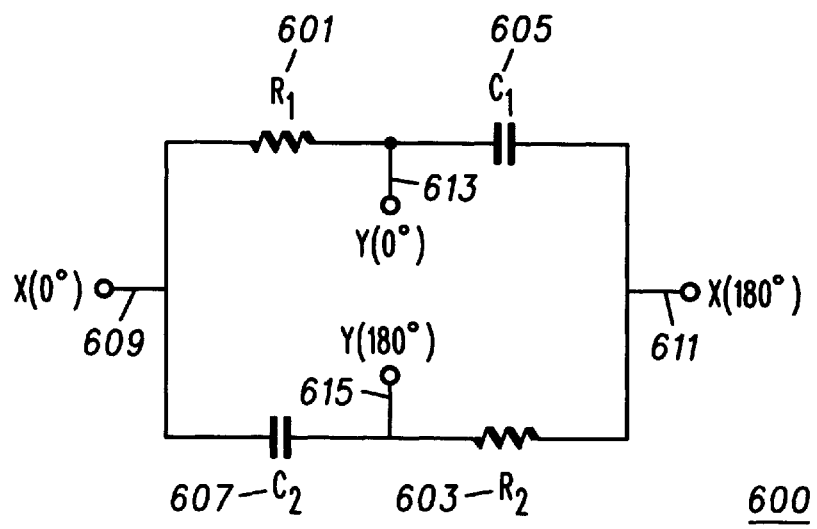
FIG. 6 is a circuit diagram of a prior art passive phase shift network.
Figure 7:
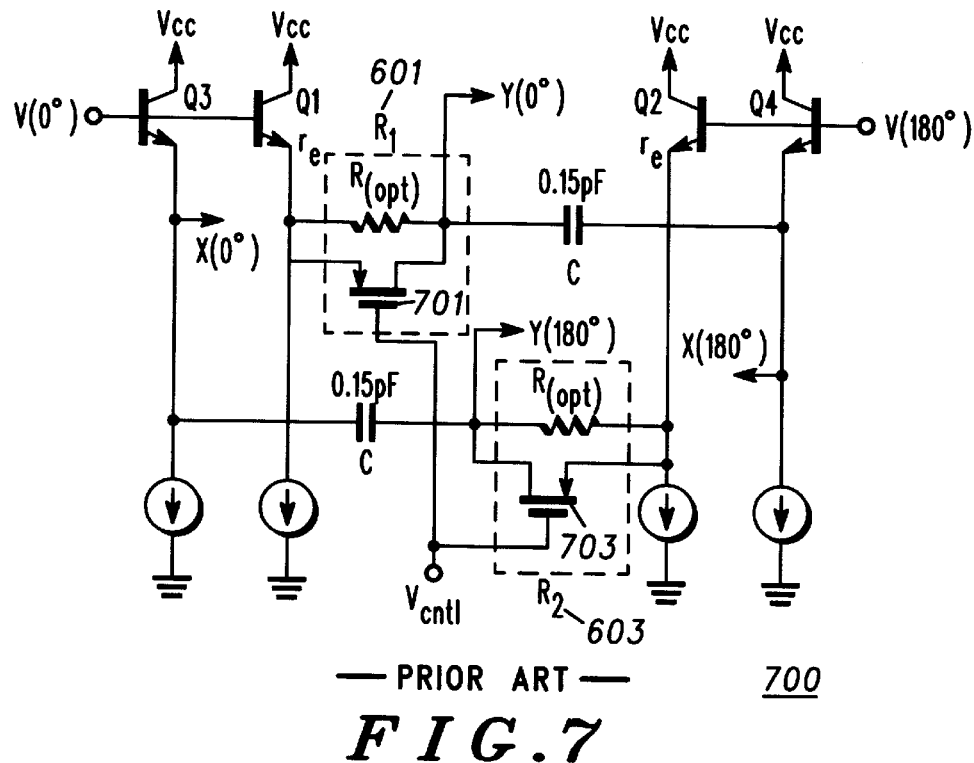
FIG. 7 is a circuit diagram of a prior art variable phase shift network.

FIG. 5 is block diagram of a frequency divider 412 which forms a portion of the RF quadrature signal generator (320, 370) of the preferred embodiment of the present invention. The frequency divider 412 is comprised of a pair of flip-flops where the first flip-flop is master flip-flop 528 and the second flip-flop is slave flip-flop 530.

Figure 1:
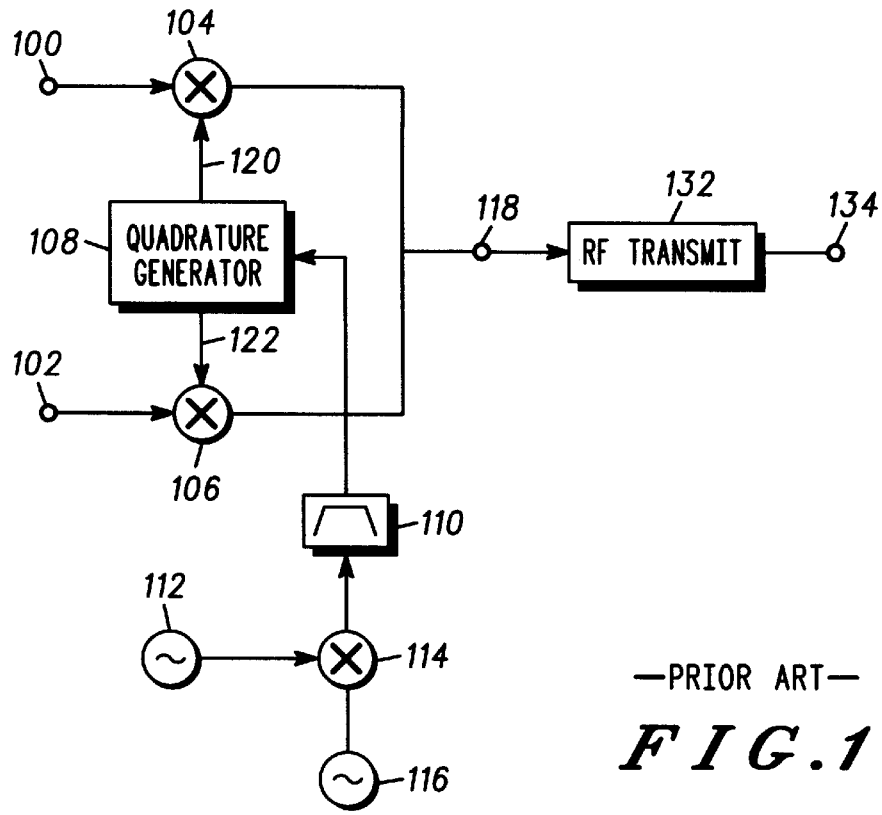
FIG. 1 is a block diagram of a prior art direct conversion transmit quadrature modulator utilizing an offset loop.
Figure 2:
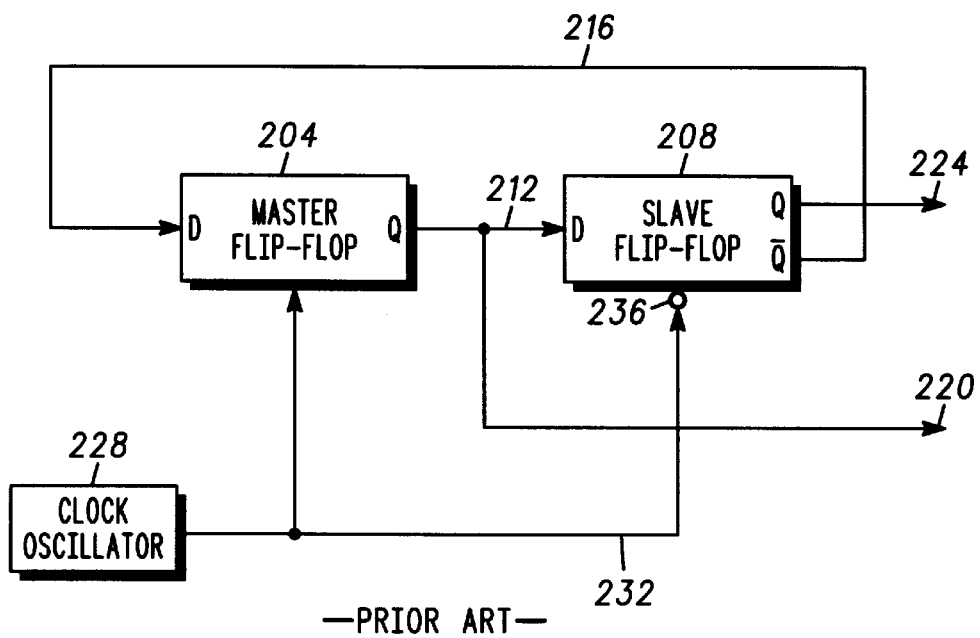
FIG. 2 is a block diagram of a prior art flip-flop pair used for dividing a clock signal in half and generating a pair of signals in phase quadrature.

An output of master flip-flop 528, here a differential output on lines 520 and 522, is coupled to an input of slave flip-flop 530. An output of slave flip-flop 530 is inverted and coupled as a differential output on lines 524 and 526 to an input of master flip-flop 528. The differential output generated at the output of the second flip-flip, slave flip-flop 530, also appears on lines 414 and 416, which is the frequency divided differential signal. Unlike the prior art flip-flop pair used for quadrature signal generation in FIG. 2 where a pair of signals in phase quadrature are extracted from the outputs of each of the flip-flops of the flip-flop pair, here an output signal is generated from only the slave flip-flop 530. In FIG. 5, the capacitive loading on lines 520 and 522 is thus reduced, and the overall frequency performance of the frequency divider is therefore increased. In alternate embodiments, the frequency divided differential signal is extracted from the output of the first flip-flop, master flip-flop 528, rather than from the slave flip-flop 530, and the frequency performance of the frequency divider is increased because the capacitive loading on the output of the slave flip-flop 530 is reduced.

The apparatus for generating radio frequency signals that are frequency divided and in a pre-determined phase relationship in accordance with the present invention has several advantages over the previous quadrature signal generation systems. Since only a frequency divided signal is extracted from the frequency divider rather than a pair of signals in phase quadrature, the frequency performance of the frequency divider as well as the whole apparatus is increased. This makes possible, for example, the development of a quadrature signal generator in an integrated circuit using a given semiconductor process that would otherwise not be possible at high radio frequencies. Also, the apparatus for generating radio frequency signals that are frequency divided and in a pre-determined phase relationship makes it possible to implement a high radio frequency direct conversion radio transceiver without the need for an offset loop, thereby reducing circuit complexity and removing the necessity for costly offset loop RF filters.

The previous description of the preferred embodiments is provided to enable any person skilled in the art to make or use the apparatus for generating radio frequency signals that are frequency divided and in a pre-determined phase relationship. Various modifications to these embodiments will be readily apparent to those skilled in the art, and the generic principles defined herein may be applied to other embodiments without the use of the inventive faculty.

Figure 8:
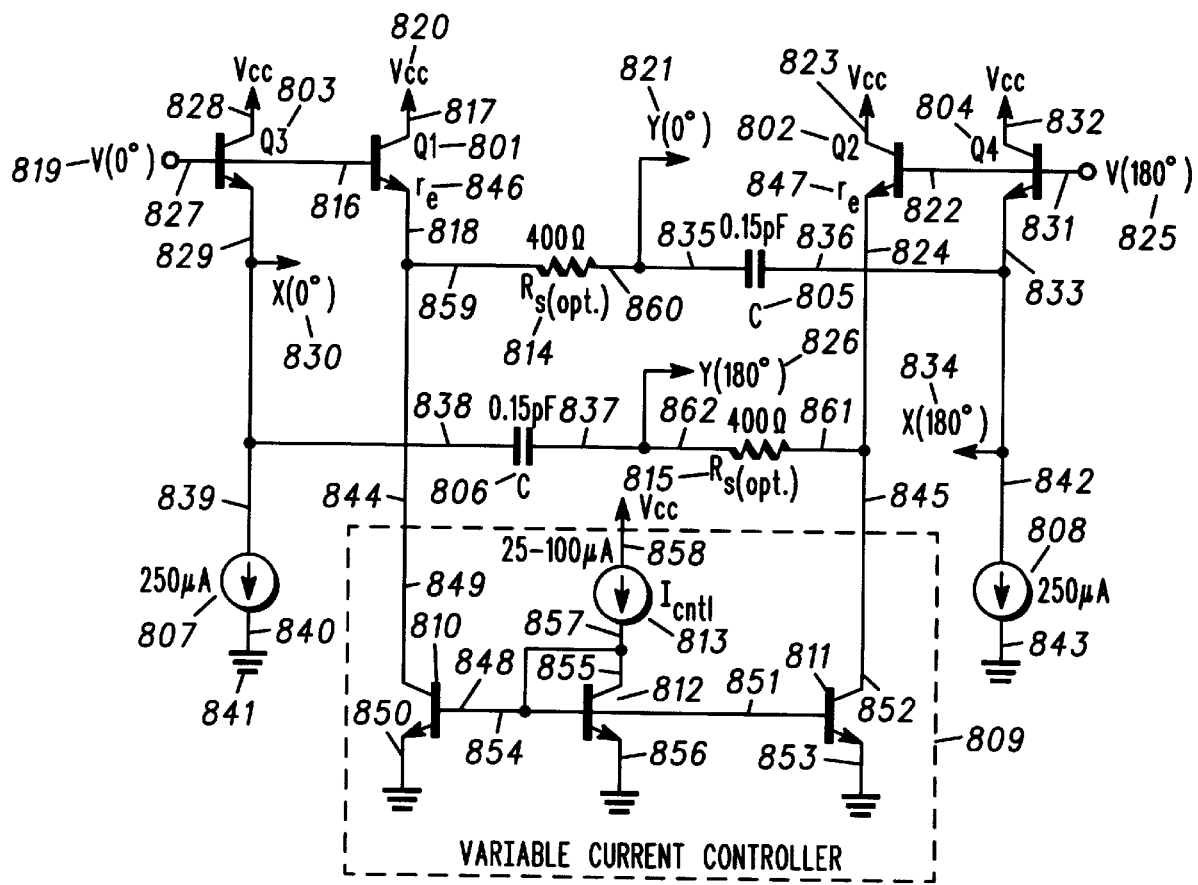
FIG. 8 is a circuit diagram of a variable phase shift network in accordance with a preferred embodiment of the present invention.

FIG. 8 is a circuit diagram of a variable phase shift network 420 for the RF quadrature signal generator 320 or 370 in accordance with a preferred embodiment of the present invention. To overcome the problems in the prior art, the variable phase shift network 420 controls an emitter resistance of an NPN transistor to vary phase shifts and receives differential input signals. The emitter resistance of an NPN transistor permits a sensitivity range large enough to cover the make tolerances of all the elements determining an absolute phase shift to permit integration of the quadrature generator on a custom integrated circuit and permits a wide range of operating frequencies. The differential input signals overcomes the imbalance created by single-ended signals. By constructing the entire variable phase shift network 420 on an integrated circuit no external parts are required.

The variable phase shift network 420 for a phase quadrature signal generator, or RF quadrature signal generator, generally comprises a first NPN transistor 801, a second NPN transistor 802, a third NPN transistor 803, a fourth NPN transistor 804, a first capacitor 805, a second capacitor 806, a first fixed current source 807, a second fixed current source 808 and a variable current controller 809. The variable current controller 809 generally comprises a fifth NPN transistor 810, a sixth NPN transistor 811, a seventh NPN transistor 812 and a variable current source 813. Alternatively, the variable phase shift network 420 may also comprise a first resistor 814 and a second resistor 815. Individually, each of the components 801–815 in the variable phase shift network 420 is well known in the art.

The first NPN transistor 801 has a base terminal 816, a collector terminal 817 and an emitter terminal 818. The base terminal 816 of the first NPN transistor 801 is adapted to receive a first differential signal 819. The collector terminal 817 of the first NPN transistor 801 is adapted to receive a reference voltage 820. The emitter terminal 818 of the first NPN transistor 801 is adapted to produce a first quadrature output signal 821.

The second NPN transistor 802 has a base terminal 822, a collector terminal 823 and an emitter terminal 824. The base terminal 822 of the second NPN transistor 802 is adapted to receive a second differential signal 825 that is 180° out of phase with respect to the first differential signal 819. The collector terminal 823 of the second NPN transistor 802 is adapted to receive the reference voltage 820. The emitter terminal 824 of the second NPN transistor 802 is adapted to produce a second quadrature output signal 826 that is 180° out of phase with respect to the first quadrature output signal 821.

The third NPN transistor 803 has a base terminal 827, a collector terminal 828 and an emitter terminal 829. The base terminal 827 of the third NPN transistor 803 is adapted to receive the first differential signal 819. The collector terminal 828 of the third NPN transistor 803 is adapted to receive the reference voltage 820. The emitter terminal 829 of the third NPN transistor 803 is adapted to produce a first quadrature input signal 830 that is in substantially a phase quadrature relationship with respect to the first quadrature output signal 821.

The fourth NPN transistor 804 has a base terminal 831, a collector terminal 832 and an emitter terminal 833. The base terminal 831 of the fourth NPN transistor 804 is adapted to receive the second differential signal 825. The collector terminal 832 of the fourth NPN transistor 804 is adapted to receive the reference voltage 820. The emitter terminal 833 of the fourth NPN transistor 804 is adapted to produce a second quadrature input signal that is 180° out of phase with respect to the first quadrature input signal 830 and that is substantially in a phase quadrature relationship with respect to the second quadrature output signal 826.

The first capacitor 805 has a first terminal 835 and a second terminal 836. The first terminal 835 of the first capacitor 805 is coupled to the emitter terminal 818 of the first NPN transistor 801 and is adapted to produce the first quadrature output signal 821. The second terminal 836 of the first capacitor 805 is coupled to the emitter terminal 833 of the fourth NPN transistor 804.

The second capacitor 806 has a first terminal 837 and a second terminal 838. The first terminal 837 of the second capacitor 806 is coupled to the emitter terminal 824 of the second NPN transistor 802. The second terminal 838 of the second capacitor 806 is coupled to the emitter terminal 829 of the third NPN transistor 803 and is adapted to produce the second quadrature output signal.

The first fixed current source 807 has a first terminal 839 and a second terminal 840. The first terminal 839 of the first fixed current source 807 is coupled to coupled to the emitter terminal 829 of the third NPN transistor 803. The second terminal 840 of the first fixed current source 807 is coupled to a circuit ground 841.

The second fixed current source 808 has a first terminal 842 and a second terminal 843. The first terminal 842 of the second fixed current source 808 is coupled to coupled to the emitter terminal 833 of the fourth NPN transistor 804. The second terminal 843 of the second fixed current source 808 is coupled to the circuit ground 841.

The variable current controller 809 has a first terminal 843 and a second terminal 845. The first terminal 843 of the variable current controller 809 is coupled to the emitter terminal 818 of the first NPN transistor 801 and is adapted to control current in the first NPN transistor 801 to vary an emitter resistance 846 in the first NPN transistor 801. The second terminal 845 of the variable current controller 809 is coupled to the emitter terminal 824 of the second NPN transistor 802 and is adapted to control current in the second NPN transistor 802 to vary an emitter resistance 847 in the second NPN transistor 802. The variable current controller 809 controls the emitter resistance 846 in the first NPN transistor 801 and the emitter resistance 847 in the second NPN transistor 802 to adjust the phase quadrature relationship between the first quadrature output signal 821 and the first quadrature input signal 830 and to adjust the phase quadrature relationship between the second quadrature output signal 826 and the second quadrature input signal 834.

The variable phase shift network 420 addresses the need for a quadrature generator having a variable phase shift network that splits a signal into components whose phase is varied about ideal quadrature and that has a sensitivity range large enough to cover the make tolerances of all the elements determining an absolute phase shift to permit integration of the quadrature generator on a custom integrated circuit by utilizing the dynamic emitter resistance $r_s$ 846 and 847 (where $r_e$=(kT/q)/Icntl) of NPN transistors Q1 and Q2, respectively, as the variable resistive elements to control phase shift. Preferably, resistors 814 and 815<re/2 through the entire control range so there will be enough sensitivity [$\Delta(R_s+r_e)$ per $\Delta V$] to allow complete integration and maintain phase quadrature over a 2:1 range of input frequencies. Therefore, the variable phase shift network 420 offers much improved sensitivity over the voltage-variable NPN junction capacitance approach.

The variable phase shift network 420 addresses the need for a wide range of operating frequencies. The variable phase shift network 420 has a tremendous advantage over the variable $R_{ds}$ FET approach in maximum operating frequency. The reason is that $R_{total}$ (=Rs+$r_e$) in this invention can be made much smaller than the FET $R_{ds}$ because NPN parasitic capacitances don't increase as significantly as $r_e$ decreases. However, FET device parasitics $C_{gs}$, $C_{gd}$, and $C_{gb}$ increase almost linearly with decreasing $R_{ds}$. As a result, the improved circuit will provide variable phase shift and generate precision quadrature signals to 2.5 GHz in a 0.5$\mu$, 20 GHz NPN fT BiCMOS process. This produces a tenfold improvement in speed over the variable $R_{ds}$ MOS implementation in the same integrated circuit process. When this variable phase shift network 420 is designed for reduced frequencies (e.g. at about 250 MHz), the total current drain of the variable phase shift network 420 and quadrature PLL blocks will be about half of that required with the FET implementation for the same integrated circuit process.

In the illustrated embodiment of FIG. 3, the variable phase shift network 420 is implemented in a direct conversion radio transceiver 300. In alternate embodiments, the variable phase shift network 420 can be implemented in conventional heterodyne transceiver architectures.

Since the circuit in FIG. 8 is intended to operate with fairly large signals (e.g. at about 200 mV), the base-emitter junction voltages vary with signal swing. This results in an average shift in re, that is slightly more than the design value. However, this is not a problem because the amount of the shift is predictable and depends on the designed signal swing. The PLL quadrature loop will correct for this shift as it would for any make tolerance shift in the capacitive element.

In the preferred embodiment, the variable current controller 809 generally comprises the fifth NPN transistor 810, the sixth NPN transistor 811, the seventh NPN transistor 812 and the variable current source 813. The variable current controller 809 is constructed as shown in FIG. 8 and described hereinbelow. Alternatively, one skilled in the art may use other configurations of variable current controllers in place of the variable current controller 809.

The fifth NPN transistor 810 has a base terminal 848, a collector terminal 849 and an emitter terminal 850. The collector terminal 849 of the fifth NPN transistor 810 is the first terminal 844 of the variable current controller 809. The collector terminal 849 of the fifth NPN transistor 810 is coupled to the emitter terminal 818 of the first NPN transistor 801. The emitter terminal 850 of the fifth NPN transistor 810 is coupled to the circuit ground 841.

The sixth NPN transistor 811 has a base terminal 851, a collector terminal 852 and an emitter terminal 853. The collector terminal 852 of the sixth NPN transistor 811 is the second terminal 845 of the variable current controller 809. The collector terminal 852 of the sixth NPN transistor 811 is coupled to the emitter terminal 824 of the second NPN transistor. The emitter terminal 853 of the sixth NPN transistor 811 is coupled to the circuit ground 841.

The seventh NPN transistor 812 has a base terminal 854, a collector terminal 855 and an emitter terminal 856. The base terminal 854 of the seventh NPN transistor 812 is coupled to the base terminal 848 of the fifth NPN transistor 810 and to the base terminal 851 of the sixth NPN transistor 811 and to the collector terminal 855 of the seventh NPN transistor 812. The emitter terminal 856 of the seventh NPN transistor 812 is coupled to the circuit ground 841.

The variable current source 813 has a first terminal 857 and a second terminal 858. The first terminal 857 of the variable current source 813 is coupled to the collector terminal 855 of the seventh NPN transistor 812. The second terminal 858 of the variable current source 813 is coupled to the reverence voltage 820. The variable current source 813 is adapted to control current in the fifth NPN transistor 810 to vary the emitter resistance 846 in the first NPN transistor 801 and is adapted to control current in the sixth NPN transistor 811 to vary the emitter resistance 847 in the second NPN transistor 802.

In the preferred embodiment, the variable phase shift network 420 includes the first resistor 814 and the second resistor 815. The resistors 814 and 815 shown in series with $r_e$ in FIG. 8 are optional and help correct for even order distortion that occurs on each emitter with large signal swings. This distortion is not a problem when the in-phase and quadrature outputs are taken differentially, since even order distortion will then cancel. This same distortion occurs to some extent on any voltage-variable capacitor or varactor phase-shift network, but taking the quadrature (and in-phase) outputs differentially solves the imbalance created by single-ended signals and ensures that a 50% duty cycle is available at the limiter outputs for driving the quadrature mixer LO ports.

The first resistor 814 has a first terminal 859 and a second terminal 860. The first terminal 859 of the first resistor 814 is coupled to the emitter terminal 818 of the first NPN transistor 801 instead of the first terminal 835 of the first capacitor 805 that is coupled to the emitter terminal 818 of the first NPN transistor 801. The second terminal 860 of the first resistor 814 is coupled to the first terminal 835 of the first capacitor 805.

The second resistor 815 has a first terminal 861 and a second terminal 862. The first terminal 861 of the second resistor 815 is coupled to the emitter terminal 824 of the second NPN transistor 802 instead of the first terminal 837 of the second capacitor 806 that is coupled to the emitter terminal 824 of the second NPN transistor 802. The second terminal 862 of the second resistor 815 is coupled to the first terminal 837 of the second capacitor 806.

In the preferred embodiment of the RF quadrature signal generator 320 or 370, the variable phase shift network 420, as shown in FIG. 8, is used in combination with the frequency divider 412 as shown in FIG. 5. When used in combination, the capacitive loading on the frequency divider 412 is reduced, and the frequency performance of the frequency divider 412 is thus greatly improved. The utilization of the variable phase shift network 420 further improves the overall frequency performance of the RF quadrature signal generator 320 or 370.

What is claimed is:

1. An apparatus for generating radio frequency (RF) quadrature local oscillator (LO) signals for a direct conversion receiver or a direct launch transmitter of a radiotelephone, wherein the RF quadrature LO signals are at substantially a same frequency as a desired received signal detected at an antenna of the radiotelephone when the RF quadrature LO signals are used for the direct conversion receiver, and wherein the RF quadrature LO signals are at substantially a same frequency as a transmission signal transmitted from the antenna of the radiotelephone when the RF quadrature LO signals are used for the direct launch transmitter, the apparatus comprising:

an oscillator for producing an RF clock signal, wherein the RF clock signal has an RF clock frequency substantially twice the frequency as the desired received signal detected at the antenna of the radiotelephone when the RF quadrature LO signals are used for the direct conversion receiver, and wherein the RF clock signal has the RF clock frequency substantially twice the frequency as the transmission signal transmitted from the antenna of the radiotelephone when the RF quadrature LO signals are used for the direct launch transmitter;

a frequency divider coupled to the oscillator for producing a differential frequency divided signal responsive to the RF clock signal, wherein the differential frequency divided signal is at substantially the same frequency as the desired received signal detected at the antenna of the radiotelephone when the RF quadrature LO signals are used for the direct conversion receiver, and wherein the differential frequency divided signal is at substantially the same frequency as the transmission signal transmitted from the antenna of the radiotelephone when the RF quadrature LO signals are used for the direct launch transmitter, the frequency divider consisting of a pair of flip-flops having an output of a first flip-flop of the pair of flip-flops coupled to an input of a second flip-flop of the pair of flip-flops, and having an output of the second flip-flop coupled to an input of the first flip-flop, a phase shift network coupled to the frequency divider for generating a pulse train-pair in response to the differential frequency divided signal, the pulse train-pair including a first differential pulse train and a second differential pulse train, wherein the first differential pulse train and the second differential pulse train are at substantially a same frequency but offset in phase relative to one another by substantially ninety degrees;

an input buffer coupled to the oscillator and the frequency divider to produce a buffered differential RF clock signal that is applied to the frequency divider, the frequency divider producing the differential frequency divided signal at the output of the first flip-flop and the second flip-flop responsive to the buffered differential RF clock signal; and a feedback control circuit coupled to receive signals representative of phases of the first and second differential pulse trains, respectively, the feedback control circuit having a phase determining circuit for determining a relative phase difference between the phases of the first and second differential pulse trains and for generating a control signal representative of the relative phase difference for application to the phase shift network, wherein the phase shift network adjusts the relative phase difference when the first and second differential pulse trains are beyond phase quadrature with one another to position and maintain the first and second differential pulse trains in phase quadrature with one another.

2. The apparatus for generating RF quadrature LO signals as in claim 1 further comprising limiting amplifiers to limit amplitudes of the first and second differential pulse trains generated by the phase shift network.

3. The apparatus for generating radio frequency signals as in claim 2 wherein the is coupled to a phase locked loop.

4. A direct conversion radiotelephone transmitter for converting a baseband communication signal directly to a transmission signal at a transmit frequency, the direct conversion transmitter, comprising:

modulation circuitry for modulating the baseband communication signal to form a first modulated signal and a second modulated signal;

a quadrature mixer system combined with the modulation circuitry for converting the first modulated signal and the second modulated signal into a first up-converted mixed signal and a second up-converted mixed signal, respectively, wherein the first up-converted mixed signal and the second up-converted mixed signal are in phase quadrature and are at the transmit frequency, the quadrature mixer system including:

a radio frequency (RF) clock oscillator for generating an RF clock signal, wherein the RF clock signal has a clock frequency substantially twice the transmit frequency;

an input buffer coupled to the RF clock oscillator for conditioning the RF clock signal and producing a buffered RF clock signal;

a frequency divider coupled to receive the buffered RF clock signal to produce a frequency divided signal, wherein the frequency divided signal has a divided frequency that is substantially one half the clock frequency;

a phase shift network having a first input and a second input wherein the first input is coupled to receive the frequency divided signal, the phase shift network for generating a pulse train-pair including a first differential pulse train and a second differential pulse train, wherein the first differential pulse train and the second differential pulse train are of similar frequencies but offset in phase relative to one another by approximately ninety degrees;

a first limiting amplifier coupled to receive the first differential pulse train and limit an amplitude of the first differential pulse train to produce a first limited pulse train;

a second limiting amplifier coupled to receive the second differential pulse train and limit an amplitude of the second differential pulse train to produce a second limited pulse train;

a feedback control circuit coupled to receive the first limited pulse train and the second limited pulse train, the feedback control circuit having a phase determining circuit for determining a relative phase difference between the first limited pulse train and the second limited pulse train and for generating a control signal representative of the relative phase difference for application to the second input of the phase shift network, wherein the phase shift network adjusts the relative phase difference when the first limited pulse train and the second limited pulse train are beyond phase quadrature with one another as indicated by the control signal, the feedback control circuit thereby forming a feedback control loop to position and maintain the first limited pulse train and the second limited pulse train in phase quadrature with one another;

a first mixer circuit coupled to receive the first modulated signal and the first limited pulse train, the first mixer circuit for mixing the first modulated signal and the first limited pulse train to form the first up-converted mixed signal; and a second mixer circuit coupled to receive the second modulated signal and the second limited pulse train, the second mixer circuit for mixing the second modulated signal and the second limited pulse train to form the second up-converted mixed signal.

5. A direct conversion radiotelephone receiver operable to receive a modulated signal at a receive frequency and to convert the modulated signal directly to a first baseband information signal and a second baseband information signal, wherein the first baseband information signal is in phase quadrature with the second baseband information signal, the direct conversion receiver comprising:

a quadrature mixer system for down-converting the modulated signal into the first baseband information signal and the second baseband information signal, the quadrature mixer system including:

a radio frequency (RF) clock oscillator for generating an RF clock signal, wherein the RF clock signal has a clock frequency substantially twice the receive frequency;

an input buffer coupled to the RF clock oscillator for conditioning the RF clock signal and producing a buffered RF clock signal;

a frequency divider coupled to receive the buffered RF clock signal to produce a frequency divided signal, wherein the frequency divided signal has a divided frequency that is substantially one half the clock frequency;

a phase shift network having a first input and a second input wherein the first input is coupled to receive the frequency divided signal, the phase shift network for generating a pulse train-pair including a first differential pulse train and a second differential pulse train, wherein the first differential pulse train and the second differential pulse train are of similar frequencies but offset in phase relative to one another by approximately ninety degrees;

a first limiting amplifier coupled to receive the first differential pulse train and limit an amplitude of the first differential pulse train to produce a first limited pulse train;

a second limiting amplifier coupled to receive the second differential pulse train and limit an amplitude of the second differential pulse train to produce a second limited pulse train;

a feedback control circuit coupled to receive the first limited pulse train and the second limited pulse train, the feedback control circuit having a phase determining circuit for determining a relative phase difference between the the first limited pulse train and the second limited pulse train and for generating a control signal representative of the relative phase difference for application to the second input of the phase shift network, wherein the phase shift network adjusts the relative phase difference when the first limited pulse train and the second limited pulse train are beyond phase quadrature with one another as indicated by the control signal, the feedback control circuit thereby forming a feedback control loop to position and maintain the first limited pulse train and the second limited pulse train in phase quadrature with one another;

a first mixer circuit coupled to receive the modulated signal and the first limited pulse train, the first mixer circuit for mixing the modulated signal and the first limited pulse train to produce the first baseband information signal; and a second mixer circuit coupled to receive the modulated signal and the second limited pulse train, the second mixer circuit for mixing the modulated signal and the second limited pulse train to produce the second baseband information signal.

* * * * *